United States Patent
Matsunaga

(10) Patent No.: US 6,195,789 B1
(45) Date of Patent: Feb. 27, 2001

(54) METHOD FOR CIRCUIT DESIGN ON A SPHERICAL SEMICONDUCTOR HAVING CRITICAL DIMENSIONS

(75) Inventor: Eiji Matsunaga, Lewisville, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/163,418

(22) Filed: Sep. 30, 1998

Related U.S. Application Data

(60) Provisional application No. 60/092,349, filed on Jul. 10, 1998.

(51) Int. Cl.[7] ............................. G06F 17/10; G06F 7/60
(52) U.S. Cl. .................................. 716/19; 716/8; 716/20; 355/43; 382/276; 345/420; 345/424
(58) Field of Search ................................ 355/43; 382/276; 716/19, 20, 8; 345/420, 424; 700/98; 709/201

(56) References Cited

U.S. PATENT DOCUMENTS

| | | | |
|---|---|---|---|
| 5,361,385 | * 11/1994 | Bakalash | 345/424 |
| 5,367,465 | * 11/1994 | Tazawa et al. | 700/98 |
| 5,416,729 | * 5/1995 | Leon et al. | 716/20 |
| 5,461,455 | * 10/1995 | Coteus et al. | 355/43 |
| 5,644,688 | * 7/1997 | Leon et al. | 345/420 |
| 5,661,663 | * 8/1997 | Scepanovic et al. | 716/8 |
| 5,802,290 | * 9/1998 | Casselman | 709/201 |
| 5,901,252 | 5/1999 | Kawakami et al. | 382/276 |
| 6,071,315 | * 6/2000 | Ramamurthi et al. | 716/19 |

OTHER PUBLICATIONS

Brown, C., Work on EL Microspheres May Help the Development of Photonic Crystals–Research Rolling on Spherical lasers, Apr. 14, 1997, No. 949, pp. 35(3 pp.).*

Bruner, Richard, Spherical Chip–Making Technology is Explored, Electronic News, Apr. 28, 1997, p. 60 (2 pp.).*

Ball Semiconductor Achieves Experimental Breakthrough for Building Electronic Devices on Sphere, PR Newswire, Jun. 25, 1998, p. 625DATH018 (3 pages).*

Ball Semiconductor Produces First Working Transistor Computergram International, Oct. 30 1998, No. 3528, pp. 1–2.*

Hiroshima SSDM meeting overview. (International Conference on Solid State Devices and Materials), Solid State Technology, Nov. 1, 1998, pp. 1–2.

Latest Research Working Transistor Built on a Sphere, Electronic Materials Technology News, vol. 12, Issue 11, Nov. 19, 1998, pp. 1–2.

Hogan, H., The Future in a Silicon–Crystal Ball. (Ball Semiconductors plan for spherical microprocessor chips) (Company Business and Marketing), Electronic Business, p. 28(1), Feb. 1, 1999, p. 28 (3 pages).

* cited by examiner

Primary Examiner—Matthew Smith
Assistant Examiner—Jibreel Speight
(74) Attorney, Agent, or Firm—Haynes and Boone LLP

(57) ABSTRACT

A method for designing a circuit on a spherical shaped semiconductor device using a great circle and a small, which is either parallel or perpendicular to the great circle, to define critical dimensions needed for the circuit. A great-circle-small-circle framework is used that has at least one great circle and one small circle that define a critical dimension on the surface of the sphere.

16 Claims, 3 Drawing Sheets

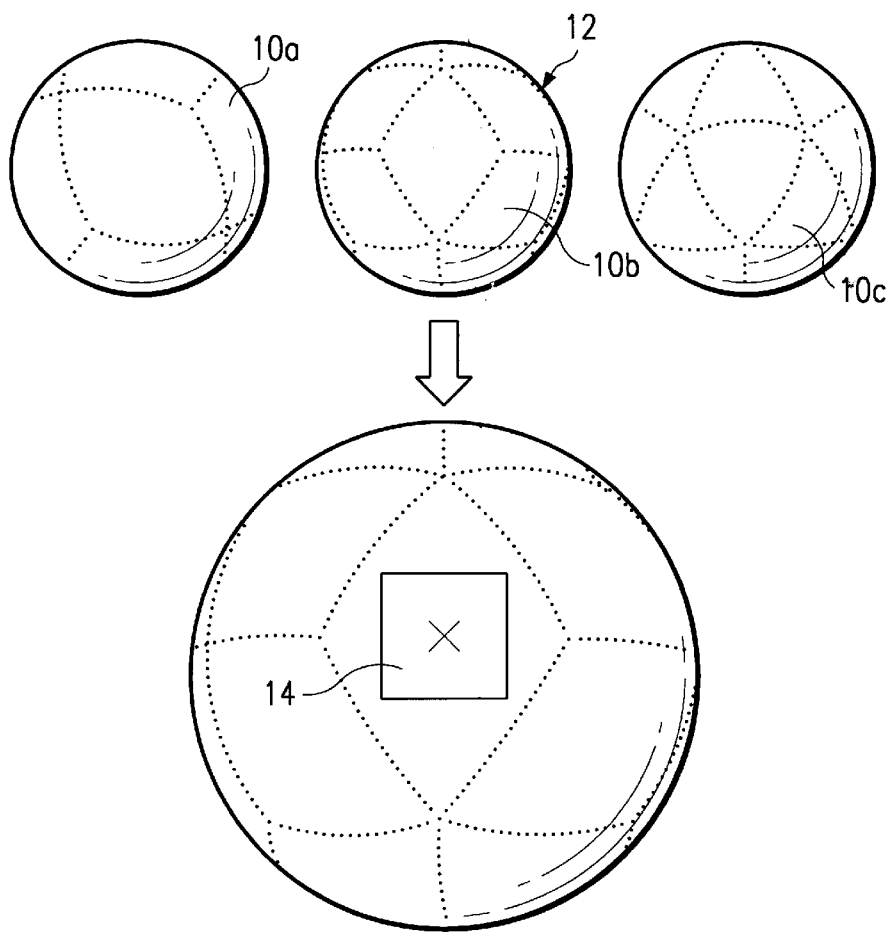
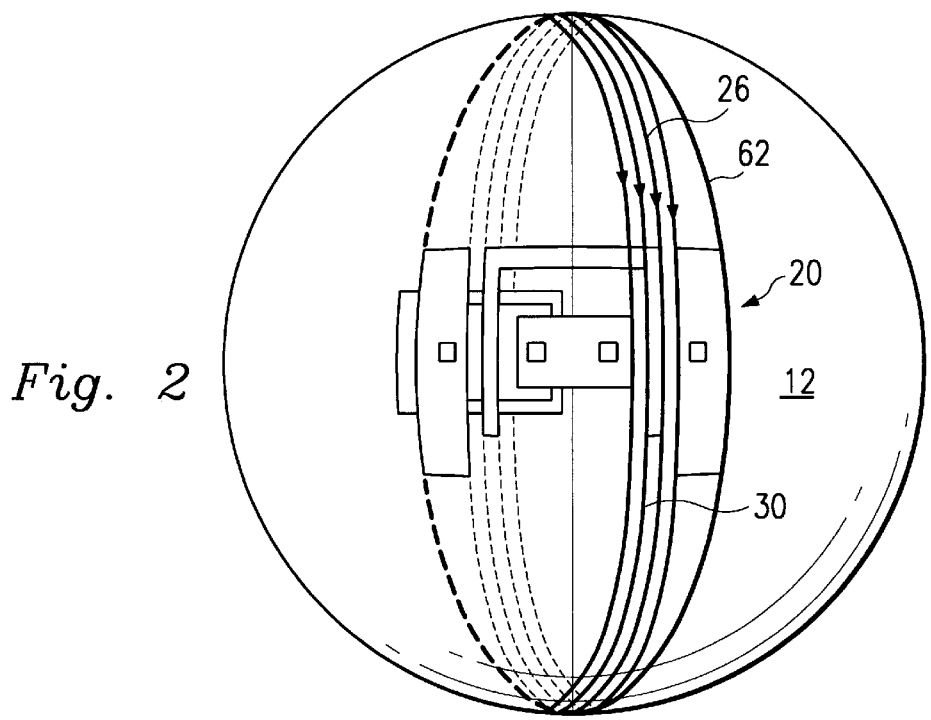
Fig. 1
Fig. 2

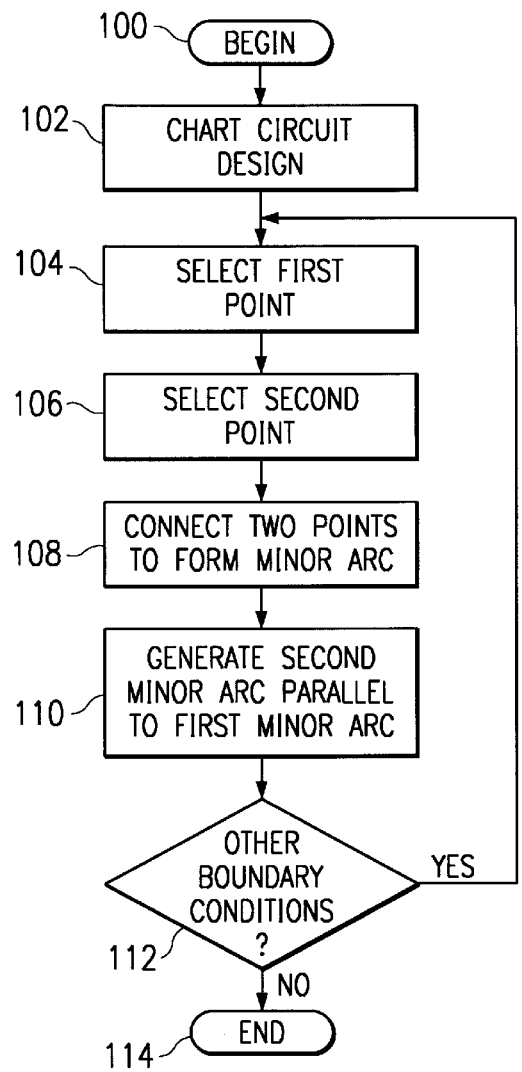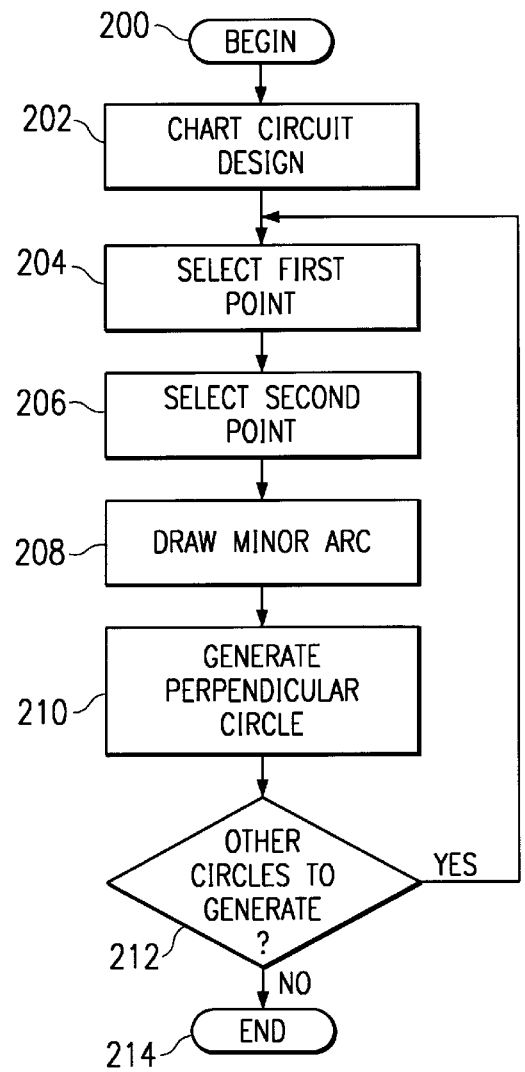
Fig. 4
Fig. 5

METHOD FOR CIRCUIT DESIGN ON A SPHERICAL SEMICONDUCTOR HAVING CRITICAL DIMENSIONS

CROSS REFERENCE

This application claims priority of Provisional Application Ser. No.: 60/092,349, filed Jul. 10, 1998.

BACKGROUND OF THE INVENTION

The invention relates generally to circuit design for semiconductor devices, and more particularly, to design methods for defining critical dimensions on a spherical semiconductor device.

Conventional integrated circuits, or "chips," are formed from two-dimensional or flat surface semiconductor wafers. The semiconductor wafer is first manufactured in a semiconductor material manufacturing facility and is then provided to a fabrication facility. At the latter facility, several layers are processed onto the semiconductor wafer surface using various design concepts, such as VLSI design. Although the processed chip includes several layers fabricated thereon, the chip still remains relatively flat.

A fabrication facility is relatively expensive due to the enormous effort and expense required to create flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping, and polishing wafers from the crystal; and heat processing the wafers. Moreover, the wafers produced by the above processes typically have many defects which are largely attributable to the difficulty in making a single, highly pure crystal due to the above cutting, grinding, and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating the chip from the wafer; assembling the chip to a lead frame, which includes wire bonding, plastic or ceramic molding, and cutting and forming the leads; positioning the assembled chip onto a printed circuit board; and mounting the assembled chip to the printed circuit board. The cutting and assembly steps introduce many errors and defects due to the precise requirements of such operations. Additionally, the positioning and mounting steps are naturally two-dimensional in character and, therefore, do not support curved or three-dimensional areas.

There are numerous problems associated with applying a two-dimensional circuit design to a three-dimensional object, such as a sphere. Specifically, VLSI circuit designs for flat chips are achieved by using two-dimensional based computer aided circuit design tools. However, these conventional methods of VLSI circuit design are not suitable for three-dimensional surfaces because modifying a two-dimensional design to fit onto a three-dimensional curved surface results in two problems. First, a two-dimensional design element, such as a line or shape, is deformed when fitted over a three-dimensional curved surface. This deformation results in distortion of the circuit design, which results in unacceptable circuit elements. Second, in two-dimensional circuit VLSI design, square and/or rectangular design units are used to modularize the design for ready transformation onto a two-dimensional surface. However, these conventional units do not fit properly onto a curved surface, such as a sphere. As a result, the distribution of the units on the surface of the sphere results in random and inefficient use of the sphere's surface area. Furthermore, the designer can not easily navigate over the surface of the sphere to determine location, direction, and space or surface area remaining.

Another problem with designing on the three-dimensional curved surface relates to designing circuits that have regions with critical dimensions enclosed by parallel or perpendicular boundary lines. For example, in order to ensure the proper performance of a semiconductor gate device, a constant gate width is essential. A gate typically has an active region with parallel boundaries and a constant width across the active region. When mapping a two-dimensional circuit design onto the three-dimensional surface, certain lines that must be kept parallel are distorted by this process. Distortion of the parallel lines results in distortion of the gate region and variations in the width of the active region. This in turn changes the characteristics and performance of the device.

Therefore, what is needed is a method for implementing a circuit design on a three-dimensional surface, such as a spherical semiconductor device, without distortion of critical dimensions.

SUMMARY OF THE INVENTION

The present invention, accordingly, provides a method for generating parallel and perpendicular lines without distortion of critical dimensions. To this end, the method for designing an integrated circuit on the surface of a spherical semiconductor device includes the steps of designing a circuit utilizing a great-circle-small-circle framework to define parallel or perpendicular lines.

One advantage of the present invention is that it results in an ability to generate a framework of parallel and perpendicular lines whereby a variety of circuits can be mapped from conventional two-dimensional circuit designs onto three-dimensional surfaces. A corresponding grid system on the sphere can be generated by combining great circle and small circles that are parallel or perpendicular to the great circle.

Another advantage of the present invention is that it allows IC designers to start their design at any point on the sphere and expand in any direction.

Another advantage of using the great-circle small-circle framework is that designers can define the orientation of a great circle without any restriction. Designers can also arrange a circuit design in any direction because a fixed grid system with unit shapes are not a limitation of the great-circle-small-circle framework.

DEFINITIONS

SPHERE: A set of points in space having equal distance to a center point. A sphere is a surface and not a solid body, although it may enclose a solid body.

GREAT CIRCLE: The section of a sphere made by a plane passing through the center of the sphere is called a great circle of the sphere.

SMALL CIRCLE: The section of a sphere made by a plane which does not pass through the center of the sphere is called a small circle of the sphere.

MINOR ARC: Two points lying along either a great circle or a small circle divide either the great circle or the small circle into two arcs, the smaller of which is called the minor arc of the points.

GREAT-CIRCLE-SMALL-CIRCLE FRAMEWORK: A framework utilizing at least one great circle and one small circle in parallel or perpendicular alignment.

SURFACE DISTANCE: The length of a minor arc of a great circle that is perpendicular to two parallel lines.

CRITICAL DIMENSIONS: Any geometrical distance in a circuit that has a special dimensional requirement and spacial separation for its boundaries.

BRIEF DESCRIPTION OF THE DRAWINGS

FIG. 1 shows a navigational pattern selected from various navigational patterns and charting a circuit design area within any unit shape of the selected navigational pattern.

FIG. 2 shows a sphere with a circuit plotted thereon.

FIG. 4 is a flowchart for generating parallel boundary lines.

FIG. 5 is a flowchart for generating perpendicular boundary lines.

DETAILED DESCRIPTION OF THE DRAWINGS AND METHODS

Figure 3:
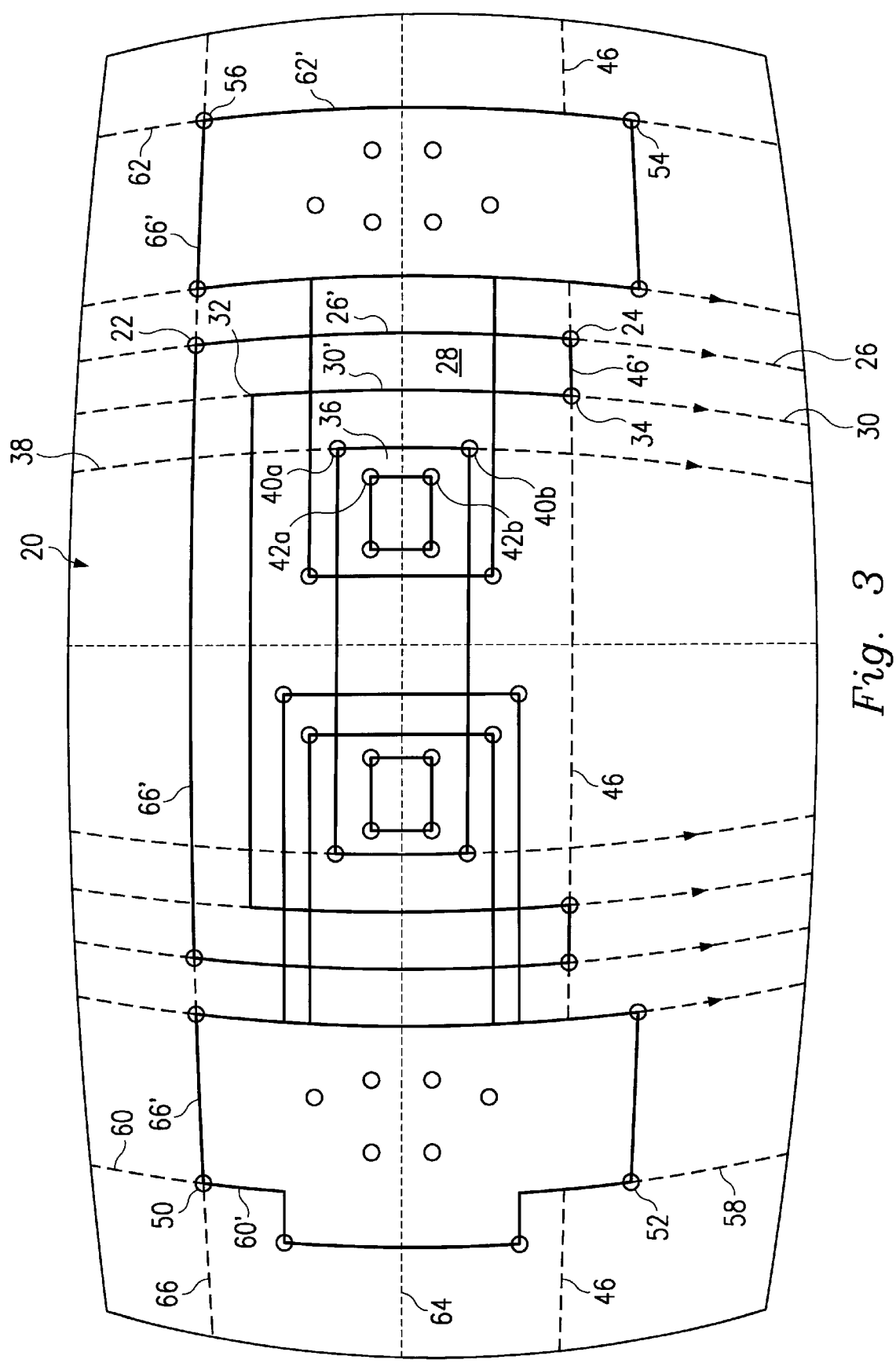
FIG. 3 shows a detailed representation of the circuit design area containing the circuit of FIG. 2.

Referring to FIG. 1, various global navigation systems 10a, 10b, and 10c are shown and one, system 10b, is selected and installed by implementing a uniform navigational pattern around the surface of a spherical device 12. The method of using the global navigation system with unit shapes therein is disclosed in co-pending U.S. Pat. No. 6,052,517 filed on Jun. 30, 1998, assigned to the same assignee as the present application, and entitled SPHERICAL CELL DESIGN FOR VLSI CIRCUIT DESIGN ON A SPHERICAL SEMICONDUCTOR, incorporated herein by reference. Once the global navigation system 10b is established, the designer selects a design area 14.

Referring now to FIGS. 2 and 3, a circuit 20 is plotted on the device 12 utilizing great circles and small circles to define the boundaries of different components of the circuit 20 having critical dimensions. Although the circuit 20 can be any type, for illustration purposes a MOS device is shown. The designer starts designing part of the circuit 20 by plotting two points 22 and 24. A great circle 26 connects the points 22 and 24 to form a minor arc 26'. Accordingly, if the minor arc 26' was extended around the sphere, then it would form the great circle 26. In defining the orientation of the great circle 26, the orientation of related critical dimensions, such as a gate region 28, are also determined. For example, the minor arc 26' defines one side of the gate region 28. The width of the gate region 28 is a critical dimension and, hence, both sides of the gate region 28 should be parallel. A small circle 30 is located adjacent the great circle 26 and parallel thereto. In this way opposite sides of the gate region 28 will be parallel. The small circle 30 is positioned to pass through points 32 and 34, thereby forming a minor arc 30' and maintaining a constant surface distance between minor arcs 26' and 30'.

Similarly, a metal contact region 36 having critical dimensions contained by boundary relations can be plotted using a second small circle (not shown) drawn parallel to a second great circle 38 passing through the points 40a and 40b, wherein the second small circle passes through the points 42a and 42b thereby forming a minor arc parallel to the second great circle. Thus, this method can be used for defining a critical dimension contained between two parallel lines that form boundaries of the circuit component containing the critical dimension.

Some boundary conditions require that two lines intersect at right angles. Accordingly, a great circle and a small circle can be utilized to create perpendicular lines, as discussed below. For example, a small circle 46 is generated to draw a minor arc 46 connecting the points 34 and 24 and is perpendicular to the minor arcs 26' and 30'.

Additionally, the framework can be used to define the boundaries of the circuit 20 based on the relative positioning of parallel and perpendicular circles. For example, the circuit 20 has four corners identified as points 50, 52, 54, and 56 plotted on the three-dimensional surface. A great circle 60 contains a minor arc 60' that connects the points 50 and 52. Likewise, a great circle 62 contains a minor arc 62' that connects the points 54 and 56. A normal vector can be drawn extending from the center of each of the great circles 60 and 62. The normal vectors extending from the great circles 60 and 62 are parallel and, thus, can be represented or contained in a plane (not shown) that is perpendicular to the great circles 60 and 62. A great circle 64 can be drawn to contain the plane that is perpendicular to the great circles 60 and 62 and contains the normal vectors. Using the great-circle-small-circle framework, a small circle 66 can be drawn parallel to the great circle 64 to contain the points 50 and 56. Accordingly, minor arcs 66' can be drawn to connect all of the points between 50 and 56 that form boundaries and ensure that the minor arc 66' is perpendicular to the minor arcs 60' and 62'. Although it may not be a requirement of the circuit design to have the minor arc 66' perpendicular to the minor arcs 60' and 62', the option is available for the circuit designer should such a geometrical requirement be part of the design parameters.

Referring now to FIG. 4, disclosed is a process 100 for establishing critical dimension for any specific circuit design. At step 102, the designer charts a circuit design on the surface of the sphere. In some cases the designer may need to select a navigation system with uniform shapes. At step 104, the designer selects a point on the surface of the sphere corresponding to a point on the circuit as a starting point for the circuit design. At step 106, the designer selects a second point corresponding to another point on the circuit along a boundary of a critical dimension. At step 108, a minor arc is drawn to form the boundary by connecting the two points such that if the minor arc was extended around the sphere a great circle would result that passes through the first and second points on the surface of the sphere. At step 110, a second minor arc is drawn by selecting two points along a second boundary that should be drawn parallel to the boundary. If the second minor arc is extended it would form a small circle parallel to the great circle. Thus, the second minor arc establishes the second side parallel to the first side and, hence, maintains the critical dimension. At step 112 it is determined if there are other boundary conditions with critical dimensions to establish. If there are other boundary conditions, then the process returns to step 104, where other points are selected and additional boundaries defined. On the other hand, if there are no other boundaries to established, then the process ends at step 114.

Referring now to FIG. 5, the process of establishing perpendicular boundaries begins at step 200. At step 202, the designer charts a circuit design on the surface of the sphere. In some cases the designer may need to select a navigation system with uniform shapes prior to charting the circuit if some navigational means is required. At step 204, the designer selects a first point on the surface of the sphere corresponding to a point on the circuit, which will be a starting point for the circuit design on the surface of the sphere. Typically, the first point is located along a boundary or outer edge of a portion of the circuit that has a critical dimension. At step 206, the designer selects a second point corresponding to another point on the circuit along the boundary with the critical dimension. At step 208, a minor arc is drawn to form the boundary by connecting the first and second points. If the minor arc was extended around the sphere along its surface, then a reference great circle would result that passes through the first and second points on the surface of the sphere. At step 210, the designer generates either a great circle or a small circle that is perpendicular to the reference great circle as required by the circuit design. These perpendicular circles form the boundaries of the circuit. Additional perpendicular circles can be generated as needed. Thus, at step 212 it is determined if there are other boundaries to generate. If there are other boundaries to generate, then the process returns to step 204. Otherwise, the process ends at step 214.

It is understood that several modifications, changes and substitutions are intended in the foregoing disclosure and in some instances some features of the invention will be employed without a corresponding use of other features. For example, other boundary conditions that do not have critical dimensions can be generated using the great-circle-small-circle framework. Additionally, the framework can be utilized on other three-dimensional shapes that allow for generation of a first plane corresponding to a great circle and other parallel or perpendicular planes corresponding to small circles. Furthermore, the major arc can be used instead of minor acr as needed by the circuit design. Accordingly, it is appropriate that the appended claims be construed broadly and in a manner consistent with the scope of the invention.

What is claimed is:

1. A method for creating a circuit design for a curved surface device, the method comprising the steps of:

generating a first arc that forms parts of a great circle for a sphere associated with the curved surface by using a pair of points on the surface of the device, wherein the two points correspond to points that are part of a boundary on the circuit design;

generating a second arc that forms part of a small circle for the sphere by using a second pair of points on the surface of the device, wherein a normal vector of the great circle is parallel to a normal vector of the small circle; and creating the circuit design by using the first and second arcs.

2. The method of claim 1 wherein the step of generating a first arc comprises the steps of:

selecting a first point of the pair of points on the surface of the device; and selecting a second point of the pair of points on the surface of the device, such that the first arc connecting the first and second points defines the great circle.

3. The method of claim 1 further comprising generating a perpendicular arc extending perpendicularly from the first arc to form a perpendicular boundary.

4. A method for implementing a circuit on a surface of a spherical semiconductor device, the method comprising the steps of:

installing a global navigation system on the surface of the device;

defining a great circle using at least two points located within the system to form a boundary; and generating a small circle to define a second boundary, wherein the boundary and the second boundary form the outer edges of a portion of the circuit having a critical dimension.

5. The method of claim 4 wherein the step of installing comprises selecting a unit shape system.

6. The method of claim 4 wherein the step of defining a great circle comprises the steps of:

selecting a first point on the surface of the device corresponding to a location along the boundary;

selecting a second point on the surface of the device corresponding to another location along the boundary; and connecting the first and second points with a minor arc, wherein the minor arc forms part of the great circle.

7. The method of claim 4 further comprising expanding the circuit design on the surface of the device in a direction parallel to the great circle.

8. The method of claim 4 further comprising expanding the circuit design on the surface of the device in a direction perpendicular to the great circle.

9. The method of claim 4 wherein the small circle is parallel to the great circle.

10. The method of claim 4 wherein the small circle is perpendicular to the great circle.

11. A method for implementing a circuit on a surface of a spherical semiconductor device, the method comprising the steps of:

installing a navigation system having a plurality of unit shapes;

charting a circuit design area within a unit shape select from the plurality of unit shapes;

selecting a first point located on the surface of the device, wherein the first point corresponds to a point on the circuit;

selecting a second point located on the surface of the device, wherein the second point corresponds to another point on the circuit such that a minor arc connecting the first and second points is part of a great circle and forms part of a boundary of the circuit; and generating an arc forming part of a small circle, wherein the small circle forms part a second boundary.

12. The method of claim 11 further comprising expanding the circuit on the surface of the device to any point of preference beyond the boundary of the selected unit shape.

13. The method of claim 11 further comprising expanding the circuit on the surface of the device in a direction parallel to the great circle.

14. The method of claim 11 further comprising expanding the circuit on the surface of the device in a direction perpendicular to the great circle.

15. The method of claim 11 wherein the small circle is parallel to the great circle.

16. The method of claim 11 wherein the small circle is perpendicular to the great circle.

* * * * *

UNITED STATES PATENT AND TRADEMARK OFFICE
CERTIFICATE OF CORRECTION

PATENT NO.    : 6,195,789 B1
DATED         : February 27, 2001
INVENTOR(S)   : Eiji Matsunaga, Nobuo Takeda, Yasunaga Suzuki It is certified that error appears in the above-identified patent and that said Letters Patent is hereby corrected as shown below:

<u>Title page,</u>
Please add inventor information as follows:

[75] Inventor:    Eiji Matsunaga, Lewisville, TX (US);
                  Nobuo Takeda, Miyagi-pref. 982-0825 Japan; and
                  Yasunaga Suzuki, Ibaraki-ken, Japan Signed and Sealed this Fourteenth Day of August, 2001

*Attest:*

*Attesting Officer*

NICHOLAS P. GODICI
*Acting Director of the United States Patent and Trademark Office*